(12) United States Patent
Lee et al.

(10) Patent No.: US 10,854,699 B2
(45) Date of Patent: Dec. 1, 2020

(54) ORGANIC LIGHT EMITTING DISPLAY DEVICE WITH AUXILIARY ELECTRODE AND METHOD OF MANUFACTURING THE SAME

(71) Applicant: LG Display Co., Ltd., Seoul (KR)

(72) Inventors: Joonsuk Lee, Seoul (KR); SeJune Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/112,330

(22) Filed: Aug. 24, 2018

(65) Prior Publication Data

US 2018/0366533 A1 Dec. 20, 2018

Related U.S. Application Data

(62) Division of application No. 15/338,048, filed on Oct. 28, 2016, now Pat. No. 10,090,370.

(30) Foreign Application Priority Data

Oct. 29, 2015 (KR) .......................... 10-2015-0151375

(51) Int. Cl.
*H01L 27/32* (2006.01)
*H01L 51/52* (2006.01)
*H01L 51/56* (2006.01)

(52) U.S. Cl.
CPC ...... *H01L 27/3276* (2013.01); *H01L 27/3213* (2013.01); *H01L 27/3246* (2013.01); *H01L 27/3248* (2013.01); *H01L 27/3279* (2013.01); *H01L 51/5218* (2013.01); *H01L 51/5221* (2013.01); *H01L 51/5228* (2013.01); *H01L 51/56* (2013.01); *H01L 51/5212* (2013.01); *H01L 2227/323* (2013.01)

(58) Field of Classification Search
CPC ............ H01L 27/3276; H01L 27/3246; H01L 27/3279; H01L 51/5228; H01L 51/56
USPC ................................... 257/40; 438/34, 35, 99
See application file for complete search history.

(56) References Cited

U.S. PATENT DOCUMENTS

| | | |
|---|---|---|
| 2006/0017375 A1 | 1/2006 | Noguchi et al. |
| 2009/0009069 A1 | 1/2009 | Takata |
| 2010/0156273 A1 | 6/2010 | Utsunomiya et al. |
| 2010/0244664 A1* | 9/2010 | Fujioka ............... H01L 51/5212 313/504 |
| 2010/0283071 A1 | 11/2010 | Li et al. |
| 2014/0077196 A1 | 3/2014 | Shim |
| 2015/0243704 A1 | 8/2015 | Lee et al. |

(Continued)

FOREIGN PATENT DOCUMENTS

| | | |
|---|---|---|
| CN | 101465368 A | 6/2009 |
| CN | 101882601 A | 11/2010 |

*Primary Examiner* — Robert T Huber
(74) *Attorney, Agent, or Firm* — Birch, Stewart, Kolasch & Birch, LLP

(57) ABSTRACT

Discussed is an organic light emitting display device with auxiliary electrode and method of manufacturing the same according to the embodiments. The present disclosure is directed to provide a top emission type transparent organic light emitting display device and a method of manufacturing the same, which provides an area of an auxiliary electrode that effectively reduces a resistance of a cathode electrode, and decreases the number of masks, thereby simplifying the manufacturing process.

10 Claims, 8 Drawing Sheets

(56) References Cited

U.S. PATENT DOCUMENTS

2016/0155790 A1    6/2016  Lee et al.
2016/0247865 A1\*  8/2016  Shin ................... H01L 27/3258

\* cited by examiner

ORGANIC LIGHT EMITTING DISPLAY DEVICE WITH AUXILIARY ELECTRODE AND METHOD OF MANUFACTURING THE SAME

CROSS-REFERENCE TO THE RELATED APPLICATIONS

This application is a Divisional of U.S. patent application Ser. No. 15/338,048 filed on Oct. 28, 2016, which claims the priority benefit of the Korean Patent Application No. 10-2015-0151375 filed on Oct. 29, 2015, all of which are hereby expressly incorporated by reference into the present application.

BACKGROUND OF THE INVENTION

Field of the Invention

The present invention relates to an organic light emitting display device, and more particularly, to a top emission type transparent organic light emitting display device and a method of manufacturing the same.

Discussion of the Related Art

Organic light emitting display devices are self-emitting devices and have low power consumption, a fast response time, high emission efficiency, high luminance, and a wide viewing angle. The organic light emitting display devices are classified into a top emission type and a bottom emission type, based on a transmission direction of light emitted from an organic light emitting device. In the bottom emission type, a circuit element is disposed between an emission layer and an image displaying surface, and for this reason, an aperture ratio is lowered. On the other hand, in the top emission type, the circuit element is not disposed between the emission layer and the image displaying surface, and thus, an aperture ratio is enhanced.

FIG. 1 is a schematic cross-sectional view of a related art top emission type organic light emitting display device. As illustrated in FIG. 1, a thin film transistor (TFT) layer T, a passivation layer 20, a first planarization layer 31, a second planarization layer 32, a first anode electrode 40, a second anode electrode 60, a first auxiliary electrode 50, a second auxiliary electrode 70, a bank 80, a partition wall 92, an organic emission layer 94, and a cathode electrode 96 may be formed in an active area AA on the substrate 10.

The TFT layer T includes an active layer 11, a gate insulation layer 12, a gate electrode 13, an interlayer dielectric 14, a source electrode 15, and a drain electrode 16. The first anode electrode 40 and the first auxiliary electrode 50 are formed on the first planarization layer 31, and the second anode electrode 60 and the second auxiliary electrode 70 are formed on the second planarization layer 32. The first auxiliary electrode 50 reduces a resistance of the cathode electrode 96 along with the second auxiliary electrode 70.

The bank 80 is formed on the second anode electrode 60 and the second auxiliary electrode 70 to define a pixel area, and the organic emission layer 94 is formed in the pixel area defined by the bank 80. The cathode electrode 96 is formed on the organic emission layer 94.

The partition wall 92 is formed on the second auxiliary electrode 70. The partition wall 92 is spaced apart from the bank 80 by a certain distance, and the second auxiliary electrode 70 and the cathode electrode 96 are connected to each other through a separation space between the partition wall 92 and the bank 80 to reduce a resistance of the cathode electrode 96.

In the top emission type, a light emitted from the organic emission layer 94 is released through the cathode electrode 96. Therefore, the cathode electrode 96 is formed of a transparent conductive material, and for this reason, a resistance of the cathode electrode 96 is high. In order to decrease the resistance of the cathode electrode 96, the cathode electrode 96 is connected to the first auxiliary electrode 50 and the second auxiliary electrode 70.

Particularly, in the related art organic light emitting display device illustrated in FIG. 1, two auxiliary electrodes (e.g., the first auxiliary electrode 50 and the second auxiliary electrode 70) connected to each other are formed for reducing the resistance of the cathode electrode 96. In this case, the second auxiliary electrode 70 is formed on the same layer as the second anode electrode 60, and thus, if a width of the second auxiliary electrode 70 is enlarged to reduce the resistance of the cathode electrode 96, a width of the second anode electrode 60 should be reduced. In this case, the pixel area of the display device is reduced, and for this reason, there is a limitation in the amount that the width of the second auxiliary electrode 70 may be enlarged. Therefore, in the related art, in order to solve the problems, the first auxiliary electrode 50 is additionally formed under the second auxiliary electrode 70, thereby reducing the resistance of the cathode electrode 96 without any reduction in pixel area.

The related art top emission type organic light emitting display device has the following problems. In the transparent organic light emitting display device that includes a transmissive part and an emissive part, the transmissive part should be formed to maximize a transmittance, and to this end, all elements should be stacked in the emissive part. However, when the TFT layer T is stacked in the emissive part, an auxiliary electrode cannot be stacked in the emissive part, and for this reason, the auxiliary electrode should be stacked separately from the TFT layer T. Two auxiliary electrodes should be vertically stacked for stacking the two auxiliary electrodes in a limited space. Also, since separate masks are used for stacking the two auxiliary electrodes on one layer, the number of masks increases, and for this reason, a manufacturing process becomes complicated. Therefore, a technology to reduce the resistance of the cathode electrode 96 effectively without an increase in number of masks is necessary.

SUMMARY OF THE INVENTION

Accordingly, the present invention is directed to provide a top emission type transparent organic light emitting display device and a method of manufacturing the same that substantially obviate one or more problems due to limitations and disadvantages of the related art.

An aspect of the present invention is directed to provide a top emission type transparent organic light emitting display device and a method of manufacturing the same, which provides an area of an auxiliary electrode that effectively reduces a resistance of a cathode electrode, and decreases the number of masks, thereby simplifying the manufacturing process.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device that includes an anode electrode in each of a plurality of pixels defined on a substrate, a bank and an organic emission layer on the anode electrode, a cathode electrode on the organic emission layer, and an auxiliary electrode connected to the cathode electrode, wherein the auxiliary electrode is disposed as a layer separate from the anode electrode and provided on the bank.

In another aspect of the present invention, there is provided a method of manufacturing an organic light emitting display device which includes forming an anode electrode on a substrate, forming a first bank on the anode electrode, forming an auxiliary electrode on the first bank and forming a second bank on the auxiliary electrode, forming an organic emission layer on the anode electrode, and forming a cathode electrode, connected to the auxiliary electrode, on the organic emission layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
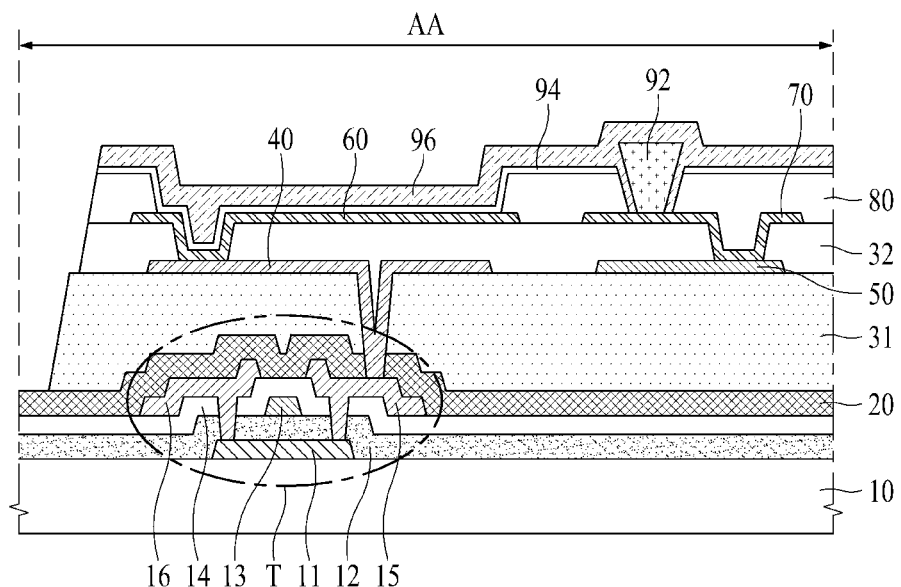
FIG. 1 is a schematic cross-sectional view of a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
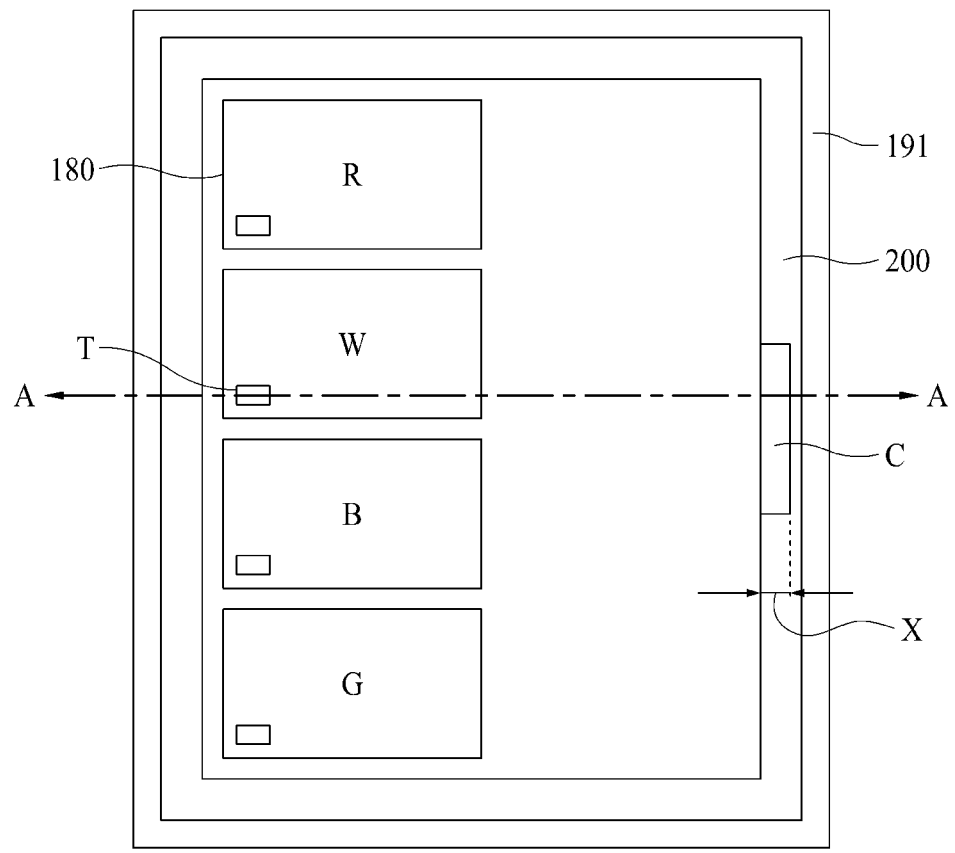
FIG. 2 is a plan view illustrating a pixel of an organic light emitting display device according to an embodiment of the present invention.

FIG. 2 is a plan view illustrating a pixel of an organic light emitting display device according to an embodiment of the present invention. A plurality of pixels may be defined on a substrate of the organic light emitting display device according to an embodiment of the present invention. As illustrated in FIG. 2, each of the plurality of pixels may include an emissive area, where four subpixels are provided, and a transmissive area.

The four subpixels may include a subpixel emitting red (R) light, a subpixel emitting white (W) light, a subpixel emitting blue (B) light, and a subpixel emitting green (G) light, but are not limited thereto. Hereinafter, a structure of each of the four subpixels will be described in detail.

Each of the subpixels may include a thin film transistor (TFT) T, an anode electrode 180, a first bank 191, an auxiliary electrode 200, and a cathode electrode. The TFT T may supply a data signal, supplied though a data line, to the anode electrode 180 in response to a gate signal supplied through a gate line.

The anode electrode 180 may be provided in the emissive area of each subpixel. The anode electrode 180 may be connected to a source electrode of the TFT T through a contact hole and may be supplied with the data signal through the TFT T.

The auxiliary electrode 200 may be provided on the first bank 191 to surround a boundary area between adjacent subpixels on a plane. In particular, the auxiliary electrode 200 may be provided on four sides of each subpixel. That is, since the auxiliary electrode 200 is provided on the first bank 191, the auxiliary electrode 200 may be provided on a layer different from the anode electrode 180 in order to separate the auxiliary electrode 200 from the anode electrode 180. The auxiliary electrode 200 may be connected to a below-described cathode electrode to reduce a resistance of the cathode electrode. Although the auxiliary electrode 200 may be provided in a closed form of surrounding four sides of one subpixel, but is not limited thereto. In other embodiments, the auxiliary electrode 200 may be provided to surround only some of four sides of one subpixel, based on a degree to which the resistance of the cathode electrode is reduced.

As described above, the transparent organic light emitting display device may include the emissive area and the transmissive area. In order not to affect an aperture ratio of the transmissive area, the auxiliary electrode 200 may be disposed on lines, such as a gate line and a sensing line, in a boundary area between adjacent subpixels.

Particularly, in the related art organic light emitting display device, an auxiliary electrode is formed as a plurality of layers for sufficiently enlarging an area of the auxiliary electrode so as to effectively reduce the resistance of the cathode electrode. On the other hand, in the present embodiment, since the auxiliary electrode 200 is formed as only one layer, the number of mask processes to stack the auxiliary electrode 200 vertically is reduced.

However, since the auxiliary electrode 200 is formed as only one layer, an area of the auxiliary electrode 200 necessary for reducing the resistance of the cathode electrode cannot be sufficiently obtained. For this reason, in the present embodiment, since the auxiliary electrode 200 is formed to surround four sides of each subpixel, an area of the auxiliary electrode 200 necessary for reducing the resistance of the cathode electrode is sufficiently obtained. Moreover, in the present embodiment, since the auxiliary electrode 200 is formed in a boundary area between adjacent subpixels, an aperture ratio of each subpixel is maintained as-is.

The cathode electrode is formed in a whole area that includes a pixel area, including the emissive area and the transmissive area, and a space between pixel areas. The cathode electrode may be connected to a driving power supply unit and may be supplied with a driving power.

Figure 3:
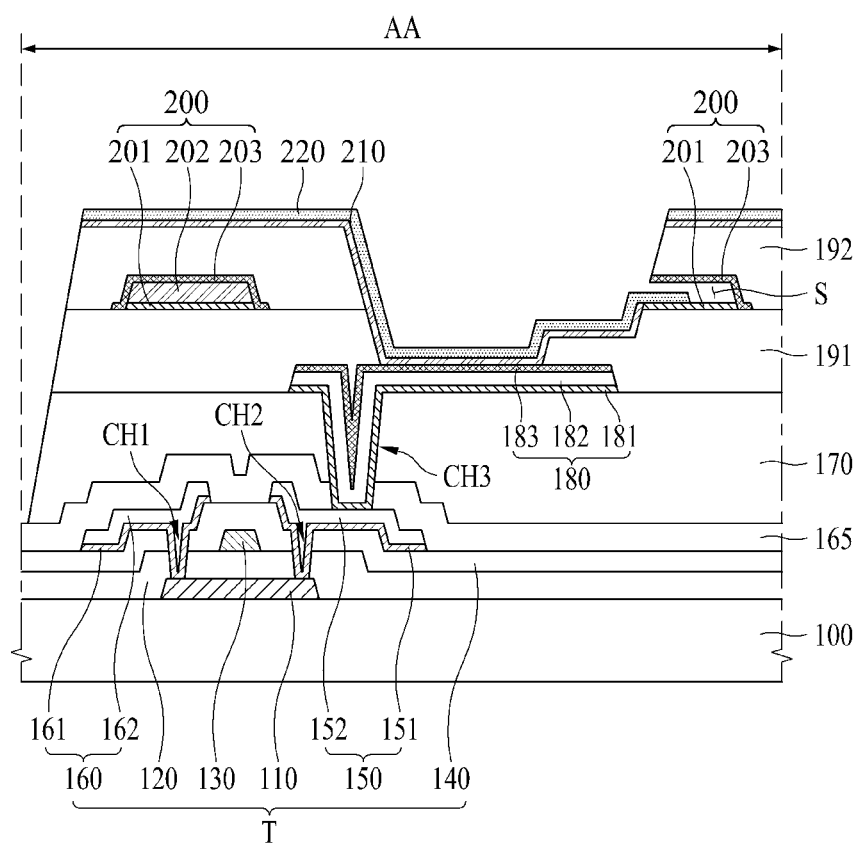
FIG. 3 is a cross-sectional view taken along line A-A of FIG. 2 in the organic light emitting display device according to an embodiment of the present invention.

FIG. 3 is a cross-sectional view taken along line A-A of FIG. 2 in the organic light emitting display device 100 according to an embodiment of the present invention. As illustrated in FIG. 3, the organic light emitting display device 100 according to an embodiment of the present invention may include an active area AA and a pad area which are provided on the substrate 100.

A TFT layer T, a passivation layer 165, a planarization layer 170, an anode electrode 180, a first bank 191, an auxiliary electrode 200, a second bank 192, an organic emission layer 210, and a cathode electrode 220 may be formed in the active area AA on the substrate 100. The TFT layer T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. A light shielding layer may be further formed between the substrate 100 and the active layer 110, and in this case, external light incident through a bottom of the substrate 100 is blocked by the light shielding layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto. The gate insulation layer 120 may extend to a whole portion of the active area AA including a transmissive area TA.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof, but is not limited thereto.

The interlayer dielectric 140 may be formed on the gate electrode 130. The interlayer dielectric 140 may be formed of the same inorganic insulating material as that of the gate insulation layer 120, for example, may be formed of silicon oxide (SiOx), silicon nitride (SiNx), or a multilayer thereof, but is not limited thereto. The interlayer dielectric 140 may extend to the whole portion of the active area AA including the transmissive area TA.

The source electrode 150 and the drain electrode 160 may be formed to face each other on the interlayer dielectric 140. A first contact hole CH1 exposing one end region of the active layer 110 and a second contact hole CH2 exposing the other end region of the active layer 110 may be included in the gate insulation layer 120 and the interlayer dielectric 140. The source electrode 150 may be connected to the other end region of the active layer 110 through the second contact hole CH2, and the drain electrode 160 may be connected to the one end region of the active layer 110 through the first contact hole CH1.

The source electrode 150 may include a lower source electrode 151 and an upper source electrode 152. The lower source electrode 151 may be formed between the interlayer dielectric 140 and the upper source electrode 152 to enhance an adhesive force between the interlayer dielectric 140 and the upper source electrode 152. Also, the lower source electrode 151 protects a bottom of the upper source electrode 152, thereby preventing the bottom of the upper source electrode 152 from being corroded. Therefore, an oxidation rate of the lower source electrode 151 may be lower than that of the upper source electrode 152. That is, the lower source electrode 151 may be formed of a material which is stronger in corrosion resistance than a material included in the upper source electrode 152. As described above, the lower source electrode 151 may act as an adhesion enhancement layer or an anti-corrosion layer and may be formed of an alloy (MoTi) of Mo and Ti, but is not limited thereto.

The upper source electrode 152 may be formed on a top of the lower source electrode 151. The upper source electrode 152 may be formed of Cu which is metal having a low resistance, but is not limited thereto. The upper source electrode 152 may be formed of metal which is relatively lower in resistance than the lower source electrode 151. In order to lower a total resistance of the source electrode 150, a thickness of the upper source electrode 152 may be formed thicker than that of the lower source electrode 151.

Similarly to the above-described source electrode 150, the drain electrode 160 may include a lower drain electrode 161 and an upper drain electrode 162. The lower drain electrode 161 may be formed between the interlayer dielectric 140 and the upper drain electrode 162 to enhance an adhesive force between the interlayer dielectric 140 and the upper drain electrode 162 and prevent a bottom of the upper drain electrode 162 from being corroded. Therefore, an oxidation rate of the lower drain electrode 161 may be lower than that of the upper drain electrode 162. That is, the lower drain electrode 161 may be formed of a material which is stronger in corrosion resistance than a material included in the upper drain electrode 162. As described above, the lower drain electrode 161 may be formed of an alloy (MoTi) of Mo and Ti which is the same as the above-described material of the lower source electrode 151, but is not limited thereto.

The upper drain electrode 162 may be formed on a top of the lower drain electrode 161 and may be formed of Cu which is the same as the above-described material of the upper source electrode 152, but is not limited thereto. A thickness of the upper drain electrode 162 may be formed thicker than that of the lower drain electrode 161, thereby lowering a total resistance of the drain electrode 160.

The upper drain electrode 162 may be formed of the same material as that of the upper source electrode 152 to have the same thickness as that of the upper source electrode 152, and the lower drain electrode 161 may be formed of the same material as that of the lower source electrode 151 to have the same thickness as that of the lower source electrode 151. In this case, the drain electrode 160 and the source electrode 150 may be simultaneously formed through the same process.

A structure of the TFT T is not limited to the illustrated structure, and may be variously modified to structures known to those skilled in the art. For example, a top gate structure where the gate electrode 130 is formed on the active layer 110 is illustrated in the drawing, but the TFT T may be formed in a bottom gate structure where the gate electrode 130 is formed under the active layer 110.

The passivation layer 165 may be formed on the TFT layer T, and in particular, may be formed on tops of the source electrode 150 and the drain electrode 160. The passivation layer 165 protects the TFT layer T. The passivation layer 165 may be formed of an inorganic insulating material (for example, SiOx and SiNx), but is not limited thereto. The passivation layer 165 may extend to the whole portion of the active area AA including the transmissive area TA.

The planarization layer 170 may be formed on the passivation layer 165. The planarization layer 170 may planarize an upper surface of the substrate 100 including the TFT layer T. The planarization layer 170 may be formed of an organic insulating material such as acryl resin, epoxy resin, phenolic resin, polyamide resin, polyimide resin, or the like, but is not limited thereto. The planarization layer 170 may extend to the whole portion of the active area AA including the transmissive area TA.

The anode electrode 180 may be formed on the planarization layer 170. A third contact hole CH3 exposing the source electrode 150 may be included in the passivation layer 165 and the planarization layer 170, and the source electrode 150 may be connected to the anode electrode 180 through the third contact hole CH3.

The anode electrode 180 may reflect light, emitted from the organic emission layer 220, in an up direction and thus may include a material which is good in reflectivity. The anode electrode 180 may include a lower anode electrode 181, a center anode electrode 182, and an upper anode electrode 183.

The lower anode electrode 181 may be formed between the planarization layer 170 and the center anode electrode 182. The lower anode electrode 181 protects a bottom of the center anode electrode 182, thereby preventing the bottom of the center anode electrode 182 from being corroded. Therefore, an oxidation rate of the lower anode electrode 181 may be lower than that of the center anode electrode 182. That is, the lower anode electrode 181 may be formed of a material which is stronger in corrosion resistance than a material included in the center anode electrode 182. The lower anode electrode 181 may be formed of a transparent conductive material such as indium tin oxide (ITO) or the like, but is not limited thereto.

The center anode electrode 182 may be formed between the lower anode electrode 181 and the upper anode electrode 183. The center anode electrode 182 may be formed of a material which is lower in resistance than and better in reflectivity than the lower anode electrode 181 and the upper anode electrode 183, and for example, may be formed of silver (Ag) and/or the like. However, the present embodiment is not limited thereto. A thickness of the center anode electrode 182 which is relatively low in resistance may be formed thicker than that of each of the lower anode electrode 181 and the upper anode electrode 183 which are relatively high in resistance, thereby lowering a total resistance of the anode electrode 180.

The upper anode electrode 183 may be formed on a top of the center anode electrode 182, thereby preventing the top of the center anode electrode 182 from being corroded. To this end, an oxidation rate of the upper anode electrode 183 may be lower than that of the center anode electrode 182. That is, the upper anode electrode 183 may be formed of a material which is stronger in corrosion resistance than a material included in the center anode electrode 182. The upper anode electrode 183 may be formed of a transparent conductive material such as ITO or the like, but is not limited thereto.

The first bank 191 may be formed on the anode electrode 180. The first bank 191 may be formed on one side and the other side of the anode electrode 180 to expose a top of the anode electrode 180. Since the first bank 191 is formed to expose the top of the anode electrode 180, an area where an image is displayed is obtained. Also, since the first bank 191 is formed on the one side and the other side of the anode electrode 180, a side surface of the anode electrode 180 vulnerable to corrosion is not exposed to the outside, thereby preventing the side surface of the anode electrode 180 from being corroded. The first bank 191 may be formed of an organic insulating material such as polyimide resin, acryl resin, benzocyclobutene (BCB), or the like, but is not limited thereto.

The auxiliary electrode 200 may be formed on the first bank 191. That is, in an embodiment of the present invention, the auxiliary electrode 200 may be formed on the first bank 191 formed on the anode electrode 180 and thus may be formed on a layer different from the anode electrode 180 in order to separate the auxiliary electrode from the anode electrode. The auxiliary electrode 200 may be connected to the cathode electrode 220 to lower the resistance of the cathode electrode 220.

As described above, the transparent organic light emitting display device may include the emissive area and the transmissive area, and in order not to affect an aperture ratio of the transmissive area, the auxiliary electrode 200 may be disposed on lines, such as a data line, a gate line and a sensing line, in a boundary area between adjacent subpixels. Particularly, in the related art organic light emitting display device, an auxiliary electrode is formed on a plurality of layers for sufficiently enlarging an area of the auxiliary electrode so as to effectively reduce the resistance of the cathode electrode. On the other hand, in the present embodiment, since the auxiliary electrode 200 is formed on only one layer different from a layer on which the anode electrode 180 is formed, the number of mask processes to stack the auxiliary electrode 200 vertically is reduced.

However, since the auxiliary electrode 200 is formed on only one layer, an area of the auxiliary electrode 200 necessary for reducing the resistance of the cathode electrode 220 cannot be sufficiently obtained. For this reason, in the present embodiment, since the auxiliary electrode 200 is formed to surround four sides of each subpixel, a sufficient area of the auxiliary electrode 200 necessary for reducing the resistance of the cathode electrode 220 is achieved.

The auxiliary electrode 200 may include a lower auxiliary electrode 201, an upper auxiliary electrode 202, and a cover auxiliary electrode 203.

The lower auxiliary electrode 201 may be formed between the first bank 191 and the upper auxiliary electrode 202 to enhance an adhesive force between the first bank 191 and the upper auxiliary electrode 202 and prevent a bottom of the upper auxiliary electrode 202 from being corroded. Therefore, an oxidation rate of the lower auxiliary electrode 201 may be lower than that of the upper auxiliary electrode 202. That is, the lower auxiliary electrode 201 may be formed of a material which is stronger in corrosion resistance than a material included in the upper auxiliary electrode 202. As described above, the lower auxiliary electrode 201 may act as an adhesion enhancement layer or an anti-corrosion layer and may be formed of an alloy (MoTi) of Mo and Ti, but is not limited thereto.

The upper auxiliary electrode 202 may be formed between the lower auxiliary electrode 201 and the cover auxiliary electrode 203. The upper auxiliary electrode 202 may be formed of copper (Cu) which is low in resistance, but is not limited thereto. The upper auxiliary electrode 202 may be formed of a material which is relatively lower in resistance than the lower auxiliary electrode 201 and the cover auxiliary electrode 203. A thickness of the upper auxiliary electrode 202 which is relatively low in resistance may be formed thicker than that of each of the lower auxiliary electrode 201 and the cover auxiliary electrode 203 which are relatively high in resistance, thereby lowering a total resistance of the auxiliary electrode 200.

The cover auxiliary electrode 203 may be formed on the upper auxiliary electrode 202. The cover auxiliary electrode 203 may be formed to cover a top and a side surface of the upper auxiliary electrode 202, thereby preventing the upper auxiliary electrode 202 from being corroded. To this end, an oxidation rate of the cover auxiliary electrode 203 may be lower than that of the upper auxiliary electrode 202. That is, the cover auxiliary electrode 203 may be formed of a material which is stronger in corrosion resistance than a material included in the upper auxiliary electrode 202.

Moreover, the cover auxiliary electrode 203 may be formed to cover up to a side surface of the lower auxiliary electrode 201. In this case, an oxidation rate of the cover auxiliary electrode 203 may be lower than that of the lower auxiliary electrode 201. That is, the cover auxiliary electrode 203 may be formed of a material which is stronger in corrosion resistance than a material included in the lower auxiliary electrode 201. The cover auxiliary electrode 203 may be formed of a transparent conductive material such as indium tin oxide (ITO) or the like, but is not limited thereto.

In an embodiment of the present invention, the cover auxiliary electrode 203 may be formed not to cover a side surface of each of the lower auxiliary electrode 201 and the upper auxiliary electrode 202 in a certain area where the cathode electrode 220 is connected to the auxiliary electrode 200, so that the cathode electrode 220 is connected to the auxiliary electrode 200 to reduce the resistance of the cathode electrode 220.

Since the auxiliary electrode 200 includes only the lower auxiliary electrode 201 and the cover auxiliary electrode 203 in the certain area, the lower auxiliary electrode 201 and the cover auxiliary electrode 203 may be spaced apart from each other by a distance corresponding to a height of the upper auxiliary electrode 202 in the certain area, and the lower auxiliary electrode 201 and the cathode electrode 220 may be electrically connected to each other through a separation space between the lower auxiliary electrode 201 and the cover auxiliary electrode 203.

Meanwhile, a width X of the certain area C (as illustrated in FIG. 2) where the auxiliary electrode 200 is connected to the cathode electrode may be determined based on a state where the cathode electrode is deposited on the auxiliary electrode 200. That is, if the cathode electrode cannot be normally connected to the auxiliary electrode 200, it is desirable for the certain area C to be enlarged.

In detail, the certain area C may be provided in a separation space between a lower auxiliary electrode 201 and a cover auxiliary electrode 203 which are formed by etching an upper auxiliary electrode 202 of the auxiliary electrode 200, and thus, in the present embodiment, the width X of the certain area C may be adjusted by widening or narrowing an area of the upper auxiliary electrode which is etched.

As described above, unlike the related art organic light emitting display device illustrated in FIG. 1, in an embodiment of the present invention, the lower auxiliary electrode 201 and the cathode electrode 220 may be electrically connected to each other through a space, obtained by removing the upper auxiliary electrode 202, in a certain area without separately forming a partition wall to obtain a space enabling a cathode electrode and an auxiliary electrode to be connected to each other.

In an embodiment of the present invention, the cover auxiliary electrode 203 and the second bank 192 may act like eaves, and thus, since the organic emission layer 210 is not deposited under the eaves, the lower auxiliary electrode 201 may be exposed. Particularly, the organic emission layer 210 may be formed by a deposition process such as an evaporation process which is excellent in straightness of a deposited material, and thus, the organic emission layer 210 is not deposited in the separation space S between the lower auxiliary electrode 201 and the cover auxiliary electrode 203 in a process of depositing the organic emission layer 210.

In FIG. 3, it is illustrated that the auxiliary electrode 200 and the anode electrode 180 do not overlap each other, but the present invention is not limited thereto. In other embodiments, the auxiliary electrode 200 and the anode electrode 180 may be formed such that a partial region of the auxiliary electrode 200 overlaps a partial region of the anode electrode 180, based on a design margin.

The second bank 192 may be formed on the auxiliary electrode 200. The second bank 192 may be formed on the auxiliary electrode 200 to expose the certain area of the auxiliary electrode 200. That is, since the second bank 192 is formed on the auxiliary electrode 200, the auxiliary electrode 200 is not exposed to the outside, and thus, the organic emission layer 210 is not deposited on the auxiliary electrode 200. However, as described above, the second bank 192 may be formed on the auxiliary electrode 200 to expose the certain area of the auxiliary electrode 200, so that a space enabling the cathode electrode 220 to be connected to the auxiliary electrode 200 is exposed to the outside.

Particularly, since the second bank 192 is formed simultaneously with the auxiliary electrode 200 by using a mask for forming the auxiliary electrode 200, the number of masks is reduced in comparison with the related art organic light emitting display device illustrated in FIG. 1. A detailed process of forming the second bank 192 will be described below.

The second bank 192 may be formed of an organic insulating material such as polyimide resin, acryl resin, benzocyclobutene (BCB), or the like identically to the first bank 191, but is not limited thereto. The first bank 191 and the second bank 192 may be formed of different materials.

The organic emission layer 210 may be formed on the anode electrode 180. The organic emission layer 210 may include a hole injection layer, a hole transport layer, an emission layer, an electron transport layer, and an electron injection layer. The organic emission layer 210 may be modified to have various structures known to those skilled in the art.

The organic emission layer 210 may extend to a top of the second bank 192. However, the organic emission layer 210 may not extend to the top of the auxiliary electrode 200 to cover the certain area of the auxiliary electrode 200. This is because when the organic emission layer 210 covers the top of the auxiliary electrode 200 (in particular, the lower auxiliary electrode 201), it is difficult to electrically connect the lower auxiliary electrode 201 to the cathode electrode 220. As described above, the organic emission layer 210 may be formed by a deposition process without a mask that covers the top of the auxiliary electrode 200, and in this case, the organic emission layer 210 may be formed on a side surface of the lower auxiliary electrode 201 exposed in the certain area.

The cathode electrode 220 may be formed on the organic emission layer 210. The cathode electrode 220 may be formed on a surface from which light is emitted, and thus may be formed of a transparent conductive material. Since the cathode electrode 220 is formed of a transparent conductive material, a resistance of the cathode electrode 220 is high, and for this reason, in order to lower the resistance of the cathode electrode 220, the cathode electrode 220 may be connected to the auxiliary electrode 200. In detail, the cathode electrode 220 may be connected to the lower auxiliary electrode 201 through a separation space between the lower auxiliary electrode 201 and the cover auxiliary electrode 203. The cathode electrode 220 may be formed by a deposition process such as a sputtering process which is not good in straightness of a deposited material, and thus, the cathode electrode 220 may be deposited in the separation space between the lower auxiliary electrode 201 and the cover auxiliary electrode 203 in a process of depositing the cathode electrode 220.

An encapsulation layer may be further formed on the cathode electrode 220 and prevents penetration of water. The encapsulation layer may use various materials known to those skilled in the art. Also, a color filter may be further formed for each subpixel and on the cathode electrode 220, and in this case, white light may be emitted from the organic emission layer 220.

FIGS. 4A to 4H are process cross-sectional views illustrating a method of manufacturing an organic light emitting display device according to an embodiment of the present invention and relate to a method of manufacturing the above-described organic light emitting display device of FIG. 3. Thus, like reference numerals refer to like elements, and in a material and a structure of each element, the same or similar descriptions are not repeated.

Figure 4A:
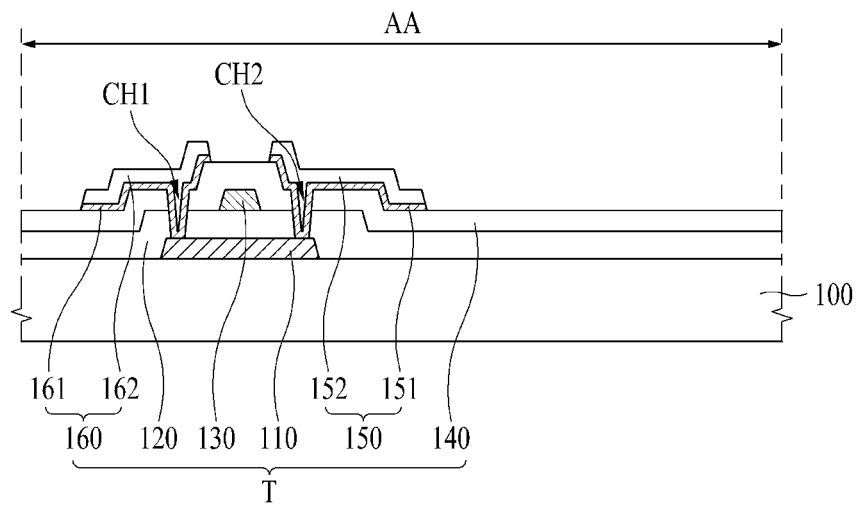
FIGS. 4A to 4H are process cross-sectional views illustrating a method of manufacturing an organic light emitting display device according to an embodiment of the present invention.

First, as illustrated in FIG. 4A, an active layer 110, a gate insulation layer 120, a gate electrode 130, an interlayer dielectric 140, a source electrode 150, and a drain electrode 160 may be sequentially formed on a substrate 100. In particular, the active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, and a first contact hole CH1 and a second contact hole CH2 may be formed in the gate insulation layer 120 and the interlayer dielectric 140. Subsequently, the drain electrode 160 connected to one end region of the active layer 110 through the contact hole CH1 may be formed, and the source electrode 150 connected to the other end region of the active layer 110 through the second contact hole CH2 may be formed.

Specifically, the active layer 110, the gate electrode 130, the source electrode 150, and the drain electrode 160 may be formed in an emissive area of the substrate 100. The gate insulation layer 120 and the interlayer dielectric 140 may be formed in an active area AA including a transmissive area as well as the emissive area.

The source electrode 150 may include a lower source electrode 151 and an upper source electrode 152, and the drain electrode 160 may include a lower drain electrode 161 and an upper drain electrode 162. The source electrode 150 and the drain electrode 160 may be simultaneously formed of the same material through the same patterning process.

Figure 4B:
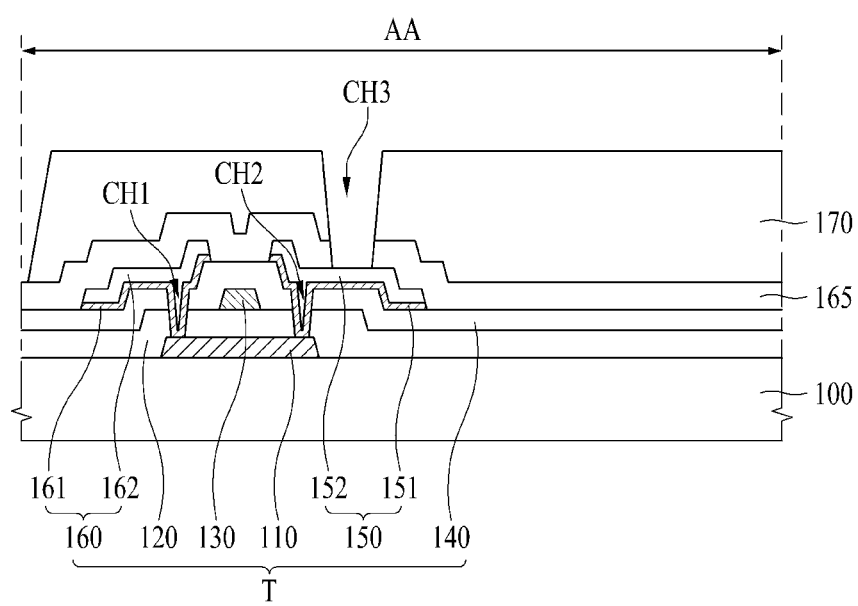

Subsequently, as illustrated in FIG. 4B, a passivation layer 165 may be formed on the source electrode 150 and the drain electrode 160, and a planarization layer 170 may be formed on the passivation layer 165. The passivation layer 165 and the planarization layer 170 may be formed in the active area AA including the transmissive area as well as the emissive area. A third contact hole CH3 may be formed in the passivation layer 165 and the planarization layer 170 in the active area AA, and the source electrode 150 may be exposed to the outside through the third contact hole CH3.

Figure 4C:
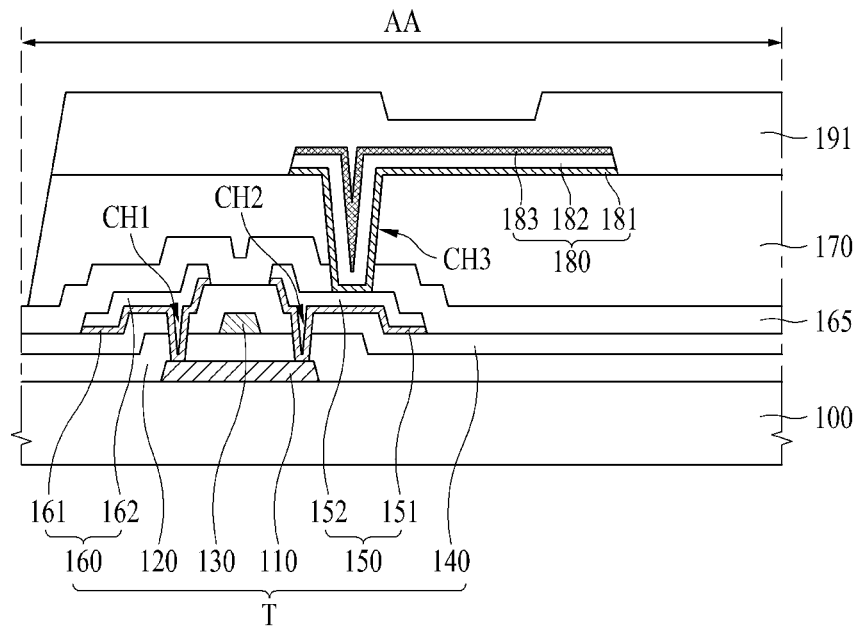

Subsequently, as illustrated in FIG. 4C, an anode electrode 180 may be formed on the planarization layer 170 in the active area AA, and a first bank 191 may be formed on the anode electrode 180. The anode electrode 180 may be formed to be connected to the source electrode 150 through the third contact hole CH3. The anode electrode 180 may include a lower anode electrode 181, a center anode electrode 182, and an upper anode electrode 183.

The first bank 191 may be formed to have different thicknesses by using a half-tone mask. In particular, the first bank 191 may be formed to have a relatively thick thickness in one side and the other side of the anode electrode 180. That is, the first bank 191 may be formed to have a relatively thin thickness in an area where the organic emission layer 210 is formed directly on a top of the anode electrode 180 in FIG. 4G to be described below. This is for protecting the anode electrode 180 in a below-described etching process and exposing only an area other than the one side and the other side of the anode electrode 180 through a process of ashing the first bank 191.

Figure 4D:
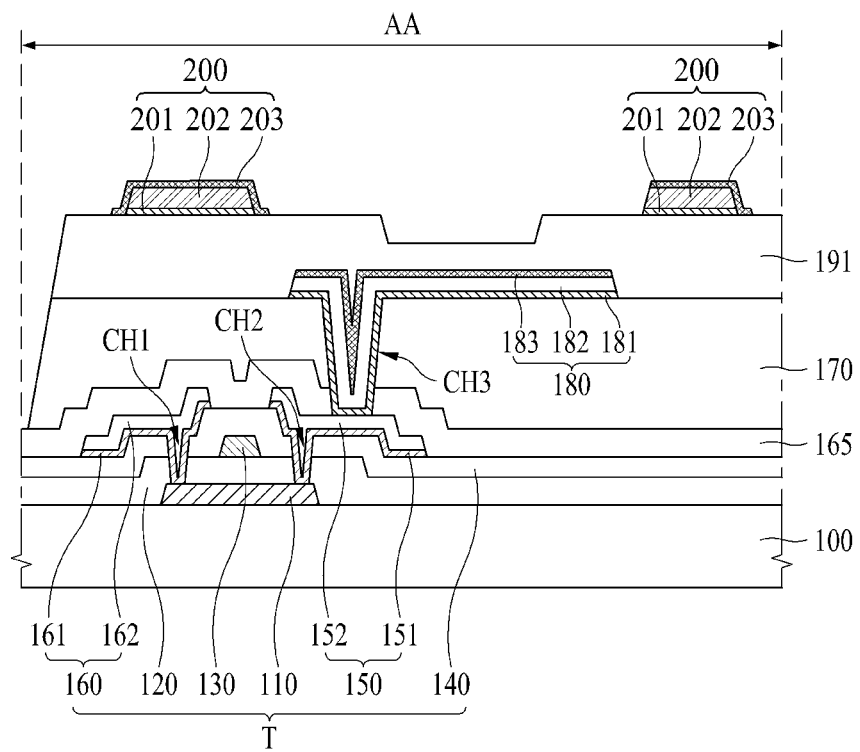

Subsequently, as illustrated in FIG. 4D, an auxiliary electrode 200 may be formed on the first bank 191. That is, the auxiliary electrode 200 may be formed on the first bank 191 formed on the anode electrode 180 and thus may be formed on a layer different from the anode electrode 180. The auxiliary electrode 200 may include a lower auxiliary electrode 201, an upper auxiliary electrode 202, and a cover auxiliary electrode 203.

Particularly, the cover auxiliary electrode 203 may be formed to cover a top and a side surface of the upper auxiliary electrode 202 and cover a side surface of the lower auxiliary electrode 201. The cover auxiliary electrode 203 may be formed not to cover a side surface of each of the upper auxiliary electrode 202 and the lower auxiliary electrode 201 in a certain area illustrated in FIG. 4D. A reason that the upper auxiliary electrode 202 and the lower auxiliary electrode 201 is not covered in only the certain area is so that the upper auxiliary electrode 202 is etched in only the certain area, and the cathode electrode 220 may be connected to the lower auxiliary electrode 201 through a space obtained by etching the upper auxiliary electrode 202.

Figure 4E:
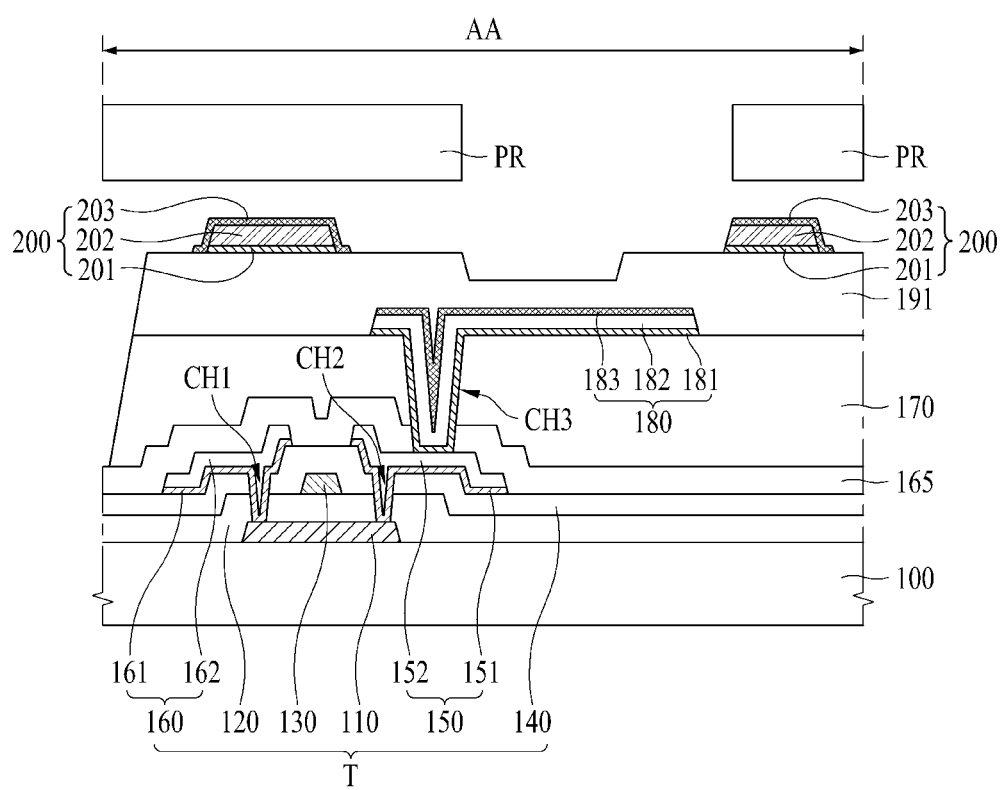

Subsequently, as illustrated in FIG. 4E, a photoresist pattern PR may be formed and aligned on the auxiliary electrode 200. Particularly, in FIG. 4G, the photoresist pattern PR may be formed as a pattern that does not cover an area, where the organic emission layer 210 is formed directly on the top of the anode electrode 180, and the certain area of the auxiliary electrode 200.

Figure 4F:
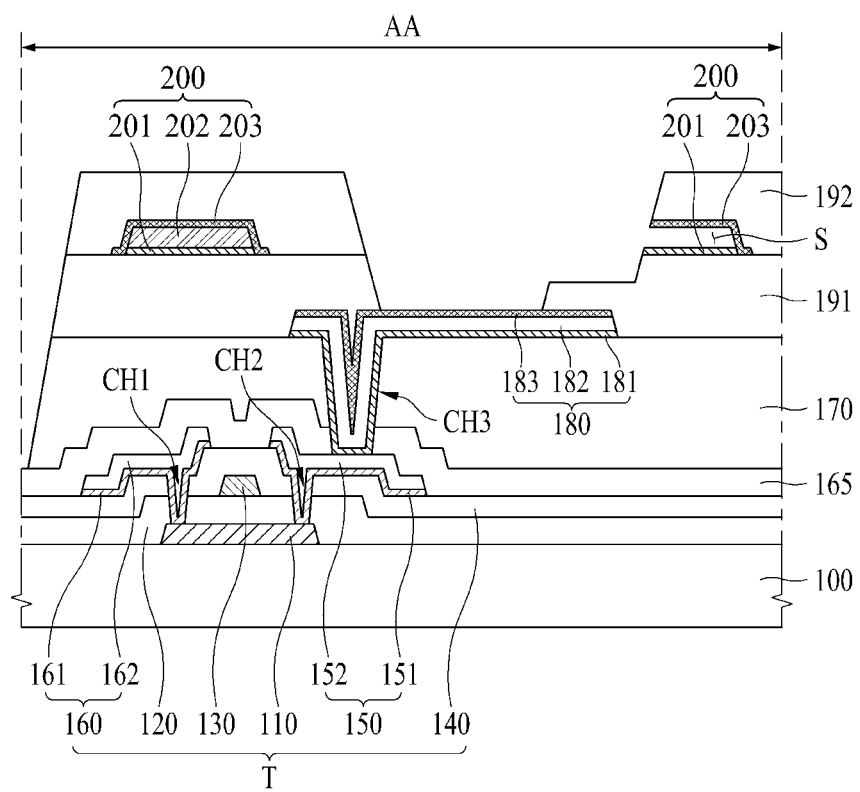

Subsequently, as illustrated in FIG. 4F, the upper auxiliary electrode 202 may be etched in the certain area by using the photoresist pattern PR as a mask, and a second bank 192 may be formed on the auxiliary electrode 200 by using the remaining photoresist pattern PR. That is, since the photoresist pattern PR illustrated in FIG. 4E is used as a mask, the auxiliary electrode 200 is not etched in an area other than the certain area. Also, since the first bank 191 is formed to cover a whole portion of the first anode electrode 180 by using as a half-tone mask in FIG. 4C described above, the anode electrode 180 is not etched, and the upper auxiliary electrode 202 may be etched and removed in only the certain area.

In particular, when the upper auxiliary electrode 202 is formed of Cu, the lower auxiliary electrode 201 is formed of an alloy (MoTi) of Mo and Ti, and the cover auxiliary electrode 203 is formed of ITO, only the upper auxiliary electrode 202 may be removed by an etchant for selectively etching only Cu. For example, only the upper auxiliary electrode 202 formed of Cu may be removed by an etchant including a ternary mixed acid system of phosphoric acid, nitric acid, and acetic acid in the etching process, but is not limited thereto. Also, a component of the etchant may be changed based on a material of the upper auxiliary electrode 202. By removing only the upper auxiliary electrode 202 after the auxiliary electrode 200 is formed, as illustrated in FIG. 4F, a separation space S may be formed between the lower auxiliary electrode 201 and the cover auxiliary electrode 203.

Moreover, the second bank 192 may be formed on the auxiliary electrode 200 by using the remaining photoresist pattern PR. By ashing the second bank 192 and the first bank 191 formed as illustrated in FIG. 4C, a substrate 100 in a state where a top of the anode electrode 180 is externally exposed may be formed as illustrated in FIG. 4F. As a result, since the second bank 192 is formed along with the auxiliary electrode 200 by using the remaining photoresist pattern PR in a process of forming the auxiliary electrode 200, the auxiliary electrode 200 is prevented from being exposed to the outside without a separate mask process being additionally performed.

Figure 4G:
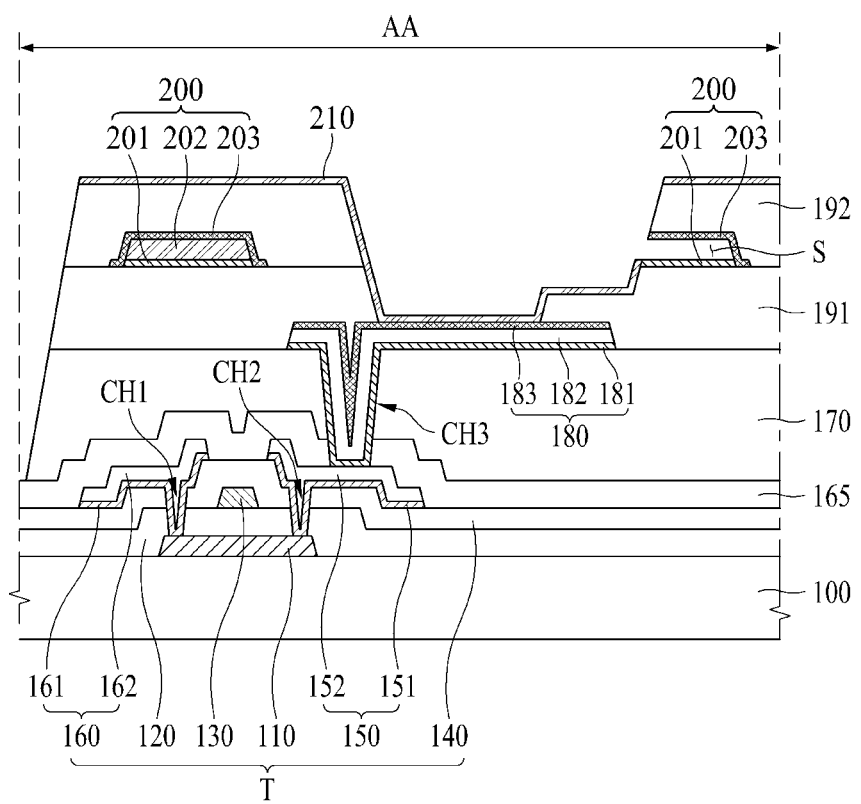

Subsequently, as seen in FIG. 4G, the organic emission layer 210 may be formed on the anode electrode 180. The organic emission layer 210 may be formed by a deposition process such as an evaporation process which is excellent in straightness of a deposited material, and thus, the organic emission layer 210 is not deposited in the separation space S between the lower auxiliary electrode 201 and the cover auxiliary electrode 203 although the organic emission layer 210 is deposited on a top of the second bank 192. That is, since the second bank 192 acts like eaves in depositing the organic emission layer 210, the organic emission layer 210 cannot be deposited in the separation space S between the lower auxiliary electrode 201 and the cover auxiliary electrode 203 even when the organic emission layer 210 is deposited.

Figure 4H:
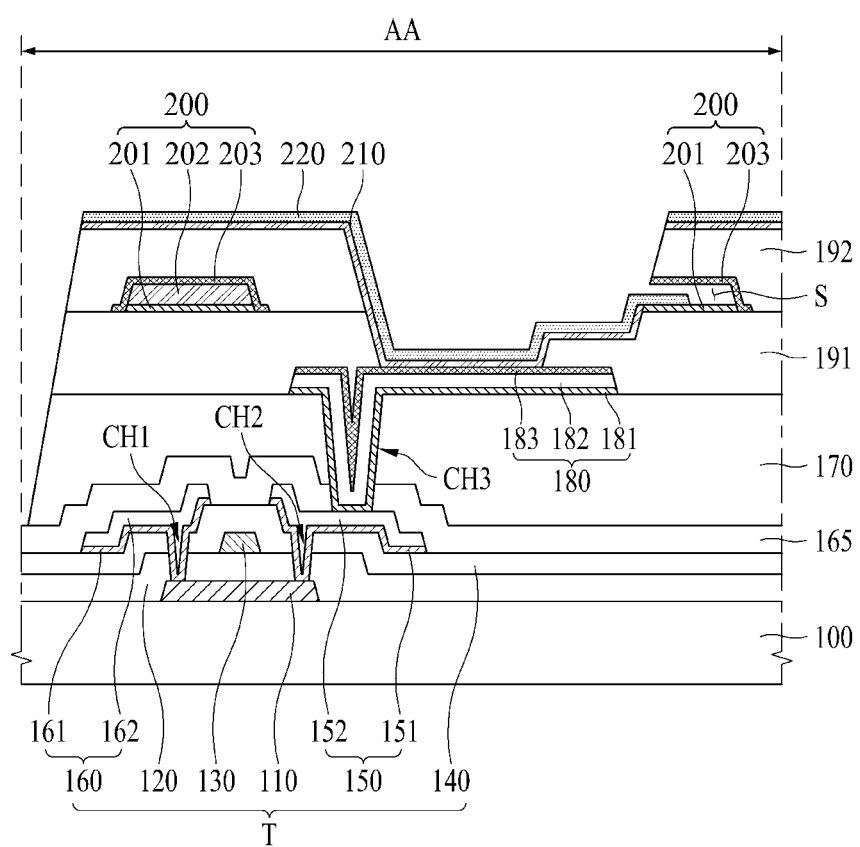

Subsequently, as illustrated in FIG. 4H, a cathode electrode 220 may be formed on the organic emission layer 210. The cathode electrode 220 may be formed to be connected to the lower auxiliary electrode 201 through the separation space S between the lower auxiliary electrode 201 and the cover auxiliary electrode 203. The cathode electrode 220 may be formed by a deposition process such as a sputtering process which is not good in straightness of a deposited material, and thus, the cathode electrode 220 may be deposited in the separation space S between the lower auxiliary electrode 201 and the cover auxiliary electrode 203 in a process of depositing the cathode electrode 220.

As described above, according to the embodiments of the present invention, since an auxiliary electrode is provided to surround a subpixel on a plane, an area of the auxiliary electrode is obtained without affecting a transmittance of a transparent organic light emitting display device, thereby effectively adjusting a resistance of a cathode electrode. Particularly, since an anode electrode and the auxiliary electrode are each formed as only one layer, the number of mask processes is reduced.

Moreover, according to the embodiments of the present invention, by omitting a process of forming a partition wall acting as eaves in order for only a cathode electrode to be connected to an auxiliary electrode, a time and the cost expended in a manufacturing process are reduced. Particularly, a second bank may be formed by using a photoresist pattern for forming an internal separation space of the auxiliary electrode connected to the cathode electrode, thereby reducing the number of mask processes.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

What is claimed is:

1. A method of manufacturing an organic light emitting display device, the method comprising:
    forming an anode electrode on a substrate;
    forming a first bank on the anode electrode;
    forming an auxiliary electrode on the first bank, wherein the auxiliary electrode includes a lower auxiliary electrode, an upper auxiliary electrode and a cover auxiliary electrode sequentially stacked in a vertical direction, and wherein the cover auxiliary electrode has an open side exposing a side surface of the upper auxiliary electrode;
    removing the upper auxiliary electrode selectively to form a separation space between the cover auxiliary electrode and the lower auxiliary electrode, wherein the lower auxiliary electrode, the separation space and the cover auxiliary electrode are sequentially stacked in the vertical direction;
    forming a second bank on the auxiliary electrode, wherein the second bank exposes the open side of the cover auxiliary electrode;
    forming an organic emission layer on the anode electrode, wherein the organic emission layer is not deposited in the separation space; and
    forming a cathode electrode on the organic emission layer, wherein the cathode electrode is deposited in the separation space to directly contact the lower auxiliary electrode within the separation space, wherein the lower auxiliary electrode, the cathode electrode, the separation space and the cover auxiliary electrode are sequentially stacked in the vertical direction.

2. The method of claim 1, wherein the forming of the first bank comprises forming the first bank by using a half-tone mask to have a relatively thicker thickness on one side and on another side of the anode electrode and have a relatively thinner thickness in another region.

3. The method of claim 1, further comprising:
    after the forming of the second bank, ashing the first bank and the second bank to externally expose the anode electrode in a region other than a one side and another side of the anode electrode.

4. The method of claim 1, wherein the forming the auxiliary electrode comprises:
    forming the auxiliary electrode; and
    forming a photoresist pattern on the auxiliary electrode to expose the side surface of the upper auxiliary electrode,
    wherein the removing of the upper auxiliary electrode in a certain area of the auxiliary electrode is conducted by using the photoresist pattern as a mask, and
    wherein the forming of the second bank is conducted by using the photoresist pattern.

5. The method of claim 1, wherein the forming the auxiliary electrode forms the auxiliary electrode to surround an exposed region of the anode electrode.

6. The method of claim 5, wherein the auxiliary electrode is formed to surround less than four sides of each suhpixel of the organic light emitting display device.

7. The method of claim 1, wherein the cover auxiliary electrode encloses an upper surface of the separation space and a side surface of the separation space that is opposite to the open side of the separation space, and the lower auxiliary electrode encloses a lower surface of the separation space.

8. The method of claim 7, wherein the cathode extends through the open side and into the separation space without contacting the cover auxiliary electrode.

9. A method of manufacturing an organic light emitting display device, the method comprising:
    forming an anode electrode on a substrate;
    forming a first bank on the anode electrode;
    forming an auxiliary electrode on the first bank, wherein the auxiliary electrode includes a lower auxiliary electrode, an upper auxiliary electrode and a cover auxiliary electrode, and wherein the cover auxiliary electrode has an open side exposing a side surface of the upper auxiliary electrode;
    removing the upper auxiliary electrode selectively to form a separation space between the cover auxiliary electrode and the lower auxiliary electrode;
    forming a second bank on the auxiliary electrode, wherein the second bank exposes the open side of the cover auxiliary electrode;
    after the forming of the second bank, ashing the first bank and the second bank to externally expose the anode electrode in a region other than a one side and another side of the anode electrode;
    forming an organic emission layer on the anode electrode, wherein the organic emission layer is not deposited in the separation space; and
    forming a cathode electrode on the organic emission layer, wherein the cathode electrode is deposited in the separation space to directly contact the lower auxiliary electrode.

10. A method of manufacturing an organic light emitting display device, the method comprising:
    forming an anode electrode on a substrate;
    forming a first bank on the anode electrode;
    forming an auxiliary electrode on the first bank, wherein the auxiliary electrode includes a lower auxiliary electrode, an upper auxiliary electrode and a cover auxiliary electrode, and wherein the cover auxiliary electrode has an open side exposing a side surface of the upper auxiliary electrode;
    removing the upper auxiliary electrode selectively to form a separation space between the cover auxiliary electrode and the lower auxiliary electrode;
    forming a second bank on the auxiliary electrode, wherein the second bank exposes the open side of the cover auxiliary electrode;
    forming an organic emission layer on the anode electrode, wherein the organic emission layer is not deposited in the separation space; and
    forming a cathode electrode on the organic emission layer; wherein the cathode electrode is deposited in the separation space to directly contact the lower auxiliary electrode,
    wherein the forming the auxiliary electrode comprises:
    forming the auxiliary electrode; and
    forming a photoresist pattern on the auxiliary electrode to expose one side surface of the upper auxiliary electrode,
    wherein the removing of the upper auxiliary electrode in a certain area of the auxiliary electrode is conducted by using the photoresist pattern as a mask, and
    wherein the forming of the second bank is conducted by using the photoresist pattern.

* * * * *